US011342499B2

(12) United States Patent
Glassman et al.

(10) Patent No.: US 11,342,499 B2
(45) Date of Patent: May 24, 2022

(54) RRAM DEVICES WITH REDUCED FORMING VOLTAGE

(71) Applicant: Intel Corporation, Santa Clara, CA (US)

(72) Inventors: Timothy E. Glassman, Portland, OR (US); Dragos Seghete, Portland, OR (US); Nathan Strutt, Beaverton, OR (US); Namrata S. Asuri, Portland, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 16/630,845

(22) PCT Filed: Sep. 18, 2017

(86) PCT No.: PCT/US2017/052109
§ 371 (c)(1),
(2) Date: Jan. 13, 2020

(87) PCT Pub. No.: WO2019/055052
PCT Pub. Date: Mar. 21, 2019

(65) Prior Publication Data
US 2020/0144496 A1    May 7, 2020

(51) Int. Cl.
*H01L 29/02*  (2006.01)
*H01L 45/00*  (2006.01)
(Continued)

(52) U.S. Cl.
CPC ............ *H01L 45/08* (2013.01); *G11C 13/004* (2013.01); *G11C 13/0007* (2013.01);
(Continued)

(58) Field of Classification Search
CPC ........................................................ H01L 45/08
See application file for complete search history.

(56) References Cited

U.S. PATENT DOCUMENTS 8,848,425 B2 *   9/2014  Schloss ............... G11C 11/5685
                                                        365/148
9,257,642 B1     2/2016  Chang et al.
(Continued)

FOREIGN PATENT DOCUMENTS

KR    10-2016-0009476    1/2016

OTHER PUBLICATIONS

International Search Report and Written Opinion for International Patent Application No. PCT/US2017/052109 dated Jan. 23, 2018, 14 pgs.

*Primary Examiner* — Caleb E Henry
(74) *Attorney, Agent, or Firm* — Schwabe, Williamson & Wyatt, P.C.

(57) ABSTRACT

Approaches for fabricating RRAM stacks with reduced forming voltage, and the resulting structures and devices, are described. In an example, a resistive random access memory (RRAM) device includes a conductive interconnect in an inter-layer dielectric (ILD) layer above a substrate. An RRAM element is on the conductive interconnect, the RRAM element including a first electrode layer on the uppermost surface of the conductive interconnect. A resistance switching layer is on the first electrode layer, the resistance switching layer including a first metal oxide material layer on the first electrode layer, and a second metal oxide material layer on the first metal oxide material layer, the second metal oxide material layer including a metal species not included in the first metal oxide material layer. An oxygen exchange layer is on the second metal oxide
(Continued)

material layer of the resistance switching layer. A second electrode layer is on the oxygen exchange layer.

22 Claims, 12 Drawing Sheets

(51) Int. Cl.
G11C 13/00 (2006.01)
H01L 23/522 (2006.01)
H01L 23/528 (2006.01)
H01L 27/24 (2006.01)

(52) U.S. Cl.
CPC ........ *G11C 13/0069* (2013.01); *H01L 23/528* (2013.01); *H01L 23/5226* (2013.01); *H01L 27/2436* (2013.01); *H01L 45/1233* (2013.01); *H01L 45/1253* (2013.01); *H01L 45/146* (2013.01); *G11C 2213/15* (2013.01); *G11C 2213/32* (2013.01); *G11C 2213/52* (2013.01); *H01L 45/1683* (2013.01)

(56) References Cited

U.S. PATENT DOCUMENTS

| 9,461,245 | B1* | 10/2016 | Yang | H01L 45/1233 |
|---|---|---|---|---|
| 10,090,465 | B2* | 10/2018 | Hsu | H01L 45/04 |
| 10,516,104 | B2* | 12/2019 | Majhi | H01L 45/1233 |
| 2012/0313069 | A1 | 12/2012 | Wang et al. | |
| 2014/0017403 | A1 | 1/2014 | Chu et al. | |
| 2015/0102279 | A1 | 4/2015 | Fujii et al. | |
| 2016/0049584 | A1* | 2/2016 | Dang | H01L 45/147 257/4 |
| 2016/0181321 | A1* | 6/2016 | Jung | H01L 45/1233 257/4 |
| 2017/0125673 | A1* | 5/2017 | Hsu | H01L 45/12 |
| 2017/0170394 | A1* | 6/2017 | Chen | H01L 45/12 |

* cited by examiner

RRAM DEVICES WITH REDUCED FORMING VOLTAGE

CROSS-REFERENCE TO RELATED APPLICATION

This patent application is a U.S. National Phase Application under 35 U.S.C. § 371 of International Application No. PCT/US2017/052109, filed Sep. 18, 2017, entitled "RRAIVI DEVICES WITH REDUCED FORMING VOLTAGE," which designates the United States of America, the entire disclosure of which is hereby incorporated by reference in its entirety and for all purposes.

TECHNICAL FIELD

Embodiments of the disclosure are in the field of integrated circuit fabrication and, in particular, approaches for fabricating resistive random access memory (RRAM) stacks with reduced forming voltage, and the resulting structures and devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Embedded SRAM and DRAM have problems with non-volatility and soft error rates, while embedded FLASH memories require additional masking layers or processing steps during manufacture, require high-voltage for programming, and have issues with endurance and reliability. Non-volatile memory based on resistance change is known as RRAM or ReRAM. Although commonly anticipated as a replacement technology for flash memory, the cost benefit and performance benefit of RRAM have not been obvious enough to most companies to proceed with the replacement. Also, for low voltage non-volatile embedded applications, operating voltages less than 1V and compatible with CMOS logic processes may be desirable but challenging to achieve.

Thus, significant improvements are still needed in the area of nonvolatile memory device manufacture and operation. In particular, significant improvements are still needed in the area of non-volatile memory arrays and their integration with logic processors.

DESCRIPTION OF THE EMBODIMENTS

Figure 1B:
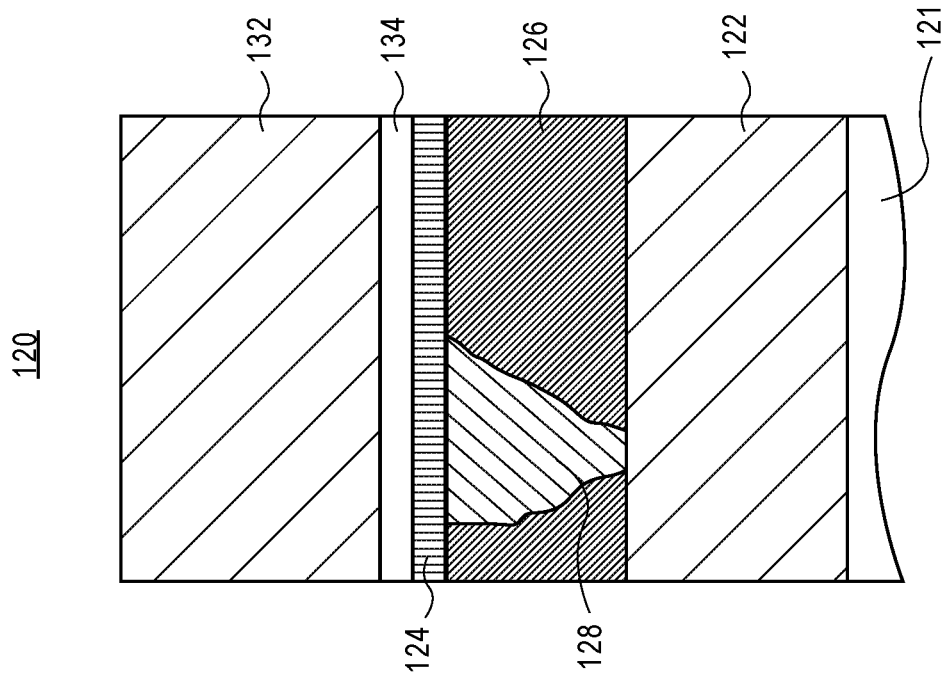
FIG. 1B illustrates a cross-sectional view of an RRAM element having reduced forming voltage, in accordance with an embodiment of the present disclosure.

Approaches for fabricating RRAM stacks with reduced forming voltage, and the resulting structures and devices, are described. In the following description, numerous specific details are set forth, such as specific RRAM material regimes and structure architectures, in order to provide a thorough understanding of embodiments of the present disclosure. It will be apparent to one skilled in the art that embodiments of the present disclosure may be practiced without these specific details. In other instances, well-known features, such as operations associated with embedded memory, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments are directed to resistive random access memory (RRAM) material stacks having a reduced forming voltage. Particular embodiments are directed to the implementation of a second metal oxide material layer, in addition to a first or primary metal oxide material layer, in an RRAM element or device. One or more embodiments of the present disclosure are directed to methods for integrating RRAM memory arrays into a logic processor. Particular embodiments may be suitable for fabricating embedded non-volatile memory (e-NVM). Approaches described herein may provide a fabrication pathway for high performance RRAM cells and increase the potential of using scaled RRAM cells for future e-NVM needs, such as for integration in system on chip (SoC) products.

To provide context, in general, forming voltages for RRAM devices should be matched to the capabilities of associated transistors. Some RRAM film stacks require especially high forming voltages which may prevent their implementation in consumer products unless a method or material is found to reduce the forming voltage. A more powerful associated transistor may be used to generate higher voltages, however, this often requires a larger transistor, reducing memory density.

In accordance with an embodiment of the present disclosure, a switching layer includes two metal oxide material layers. In a particular embodiment, a thin film of titanium oxide (TiO2) or other metal with mobile oxide is included with a primary metal oxide material layer (such as hafnium oxide, HfO2) as a cap for the primary metal oxide material layer or is included periodically throughout primary metal oxide material layer. In an embodiment, such a second metal oxide material layer is included within or on the primary metal oxide material layer, and an oxygen exchange layer (OEL) is included thereon with a subsequent anneal process that significantly lowers the forming voltages.

Figure 1A:
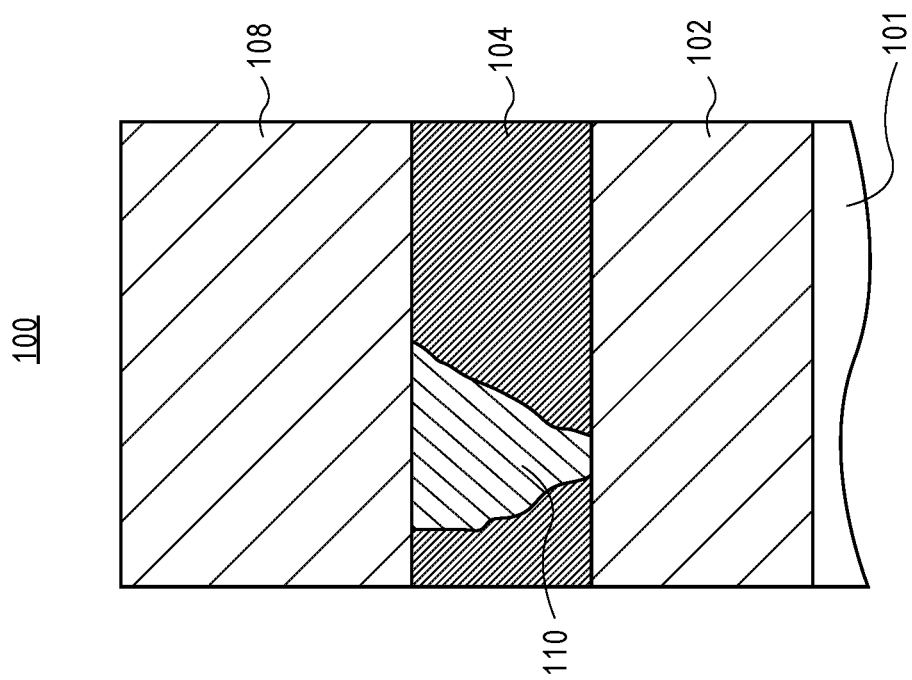
FIG. 1A illustrates a cross-sectional view of a conventional RRAM element.

To provide illustrative context, FIG. 1A illustrates a cross-sectional view of a conventional RRAM element. Referring to FIG. 1A, an RRAM element material stack 100 includes a bottom electrode disposed above a substrate 101. A resistance switching layer 104 is disposed on the bottom electrode 102. A top electrode 108 is disposed on the resistance switching layer 104. A filament 110 may be included in the resistance switching layer 104, in the case of filament-based RRAM.

An oxide RRAM-based memory stack may be fabricated to include a metal oxide material layer to reduce forming voltage. As an exemplary implementation, FIG. 1B illustrates a cross-sectional view of an RRAM element having reduced forming voltage, in accordance with an embodiment of the present disclosure.

Referring to FIG. 1B, a resistive random access memory (RRAM) element 120 includes a first electrode layer 122 disposed above a substrate 121. A primary metal oxide material layer 126 of a resistance switching layer is disposed on the first electrode layer 122. A second electrode layer 132 is disposed above an oxygen exchange layer (OEL) 134 above the primary metal oxide material layer of the resistance switching layer. A secondary metal oxide material layer 124 is disposed directly between and in contact with the OEL layer 134 and primary metal oxide material layer 126 of the resistance switching layer. In an embodiment, the secondary metal oxide material layer 124 is considered part of the resistance switching layer. As applicable throughout the present disclosure, exemplary material combinations for the first electrode layer 122, the resistance switching layer 126/124, the OEL 134, and the second electrode layer 132 are described below.

In an embodiment, a filament 128 is included in the primary metal oxide material layer 126 of the resistance switching layer to provide filament-based RRAM, as is described in greater detail below in association with FIGS. 7A and 7B. In an embodiment, although not depicted as such, the filament 128 extends into the secondary metal oxide material layer 124 of the resistance switching layer. In other embodiment, however, a filament is not included and a surface or interface-based RRAM is fabricated. As such, embodiments described herein are applicable to both filamentary and interfacial RRAM implementations.

In accordance with an embodiment of the present disclosure, the second electrode layer 132 is disposed directly on the resistance switching layer 126. However, in other embodiments, as is depicted in FIG. 1B, an oxygen exchange layer (OEL) 134 is included on or above the resistance switching layer 126. In one such embodiment, the second electrode layer 132 is disposed on the OEL 134 which in turn is disposed on the resistance switching layer 126. In an embodiment, the oxygen exchange layer 132 is formed using a deposition process such as, but not limited to, a chemical vapor deposition (CVD) process, an atomic layer deposition (ALD) process, or a physical vapor deposition (PVD) process.

As described above, an OEL 134 may be included in stack 120. To provide context, a typical resistive random access (RRAM) memory stack includes a first metal electrode, a resistance switching layer disposed on the first metal electrode, and a second metal electrode disposed on the resistance switching layer. However, an oxygen exchange layer (OEL) may be disposed on the resistance switching layer before the second electrode to facilitate resistive switching. In a metal oxide based filamentary RRAM system, in particular, a conductive filament is formed during an initial soft dielectric breakdown process. This process, known as "forming," involves application of a high voltage typically in the range of 1.0 to 3.5V between the two metal electrodes sandwiching the metal oxide switching layer, as is described in greater detail below in association with FIGS. 7A and 7B. In a metal oxide filamentary system, the conductive filament is made-up of oxygen vacancies which migrate in response to the electric field created during the forming process. In a fully stoichiometric metal oxide film sandwiched between two metal electrodes, such oxygen vacancies are created during an annealing process at temperatures above, e.g., 350 degrees Celsius. However, when an oxygen exchange layer is disposed above the metal oxide switching layer, it can serve as a more effective oxygen scavenging layer by taking oxygen from the metal oxide switching layer as a result of its oxygen affinity. An oxygen exchange layer typically is composed of metals which are identical to the metal film in the metal oxide layer or metals with higher oxygen affinity compared to the metal oxide switching layer. In the normal course of an RRAM device operation, an OEL may be implemented to serve as a reservoir for oxygen vacancies, helping to create and dissolve the conductive filament by acting as a source and a sink.

In an embodiment, the first electrode layer 122 is composed of an essentially pure metal, such as, but not limited to, tungsten (W), ruthenium (Ru) or titanium (Ti). In an embodiment, the first electrode layer 122 is formed using a deposition process such as, but not limited to, a chemical vapor deposition (CVD) process, an atomic layer deposition (ALD) process, or a physical vapor deposition (PVD) process. In another embodiment, the first electrode layer 122 is composed of a binary material, such as, but not limited to, titanium nitride (TiN) or tantalum nitride (TaN).

In an embodiment, the primary metal oxide material layer 126 of the resistance switching layer is or includes a hafnium oxide layer or a zirconium oxide layer. In an embodiment, the secondary metal oxide material layer of the resistance switching layer is or includes a titanium oxide layer of a tantalum oxide layer. In an embodiment, the primary and secondary metal oxide material layers 126/124 of the resistance switching layer are formed using a deposition process such as, but not limited to, a chemical vapor deposition (CVD) process or an atomic layer deposition (ALD) process.

In an embodiment, the second electrode layer 132 is composed of an essentially pure metal, such as, but not limited to, tungsten (W), ruthenium (Ru) or titanium (Ti). In an embodiment, the first electrode layer 132 is formed using a deposition process such as, but not limited to, a chemical vapor deposition (CVD) process, an atomic layer deposition (ALD) process, or a physical vapor deposition (PVD) process. In one embodiment, the second electrode layer 132 has a same composition as the first electrode layer 122. In another embodiment, the second electrode layer 132 has a different composition than the first electrode layer 122.

Figure 1C:
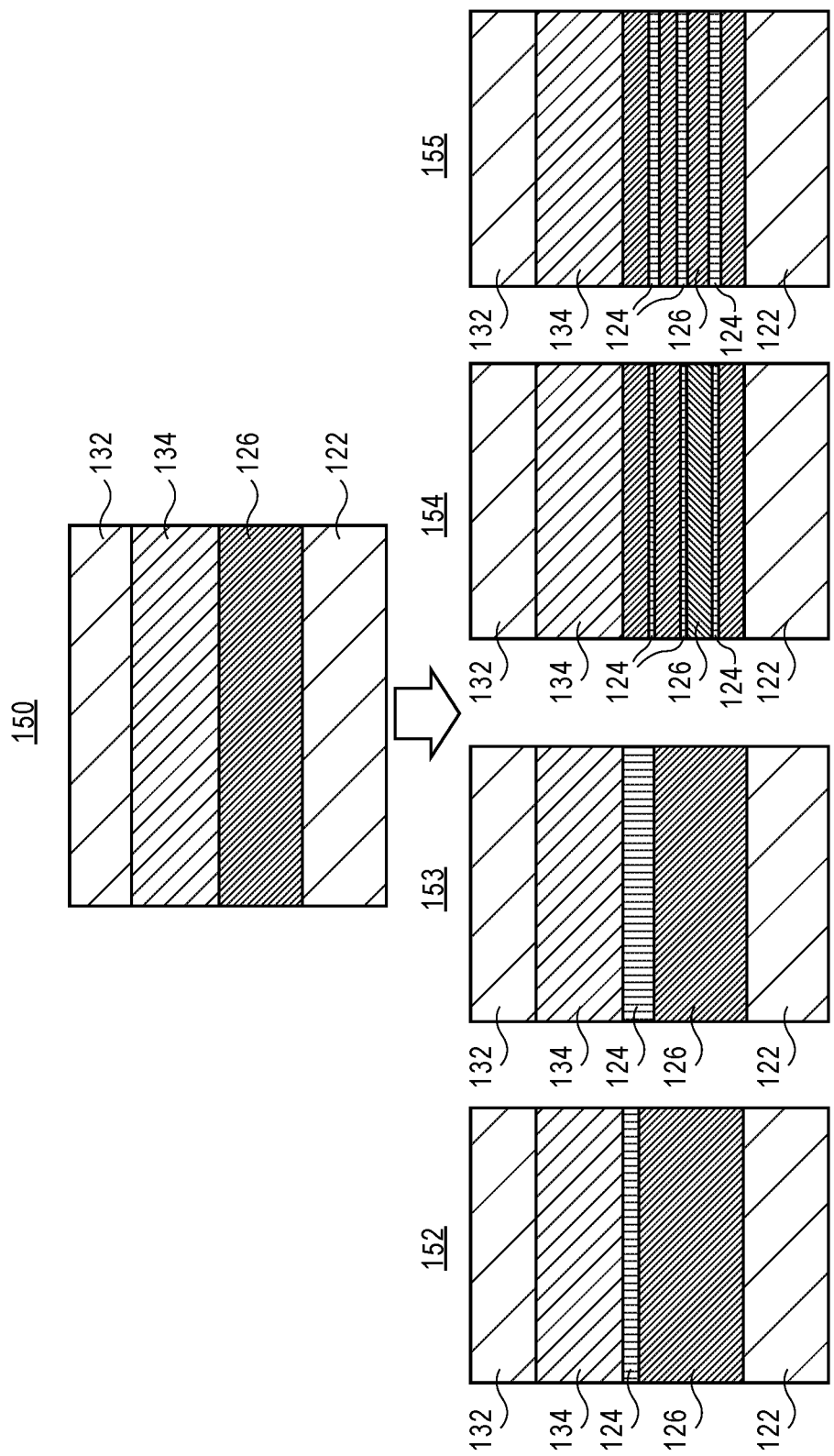
FIG. 1C illustrates cross-sectional views of a conventional RRAM element and exemplary RRAM elements having reduced forming voltage, in accordance with an embodiment of the present disclosure.

FIG. 1C illustrates cross-sectional views of a conventional RRAM element and exemplary RRAM elements having reduced forming voltage, in accordance with an embodiment of the present disclosure.

Referring to structure 150 of FIG. 1C, a conventional RRAM element includes a first electrode layer 122. A resistance switching layer 126 (e.g., a solo metal oxide material layer) is on the first electrode layer 122. An oxygen exchange layer 134 is on the resistance switching layer 126. A second electrode layer 132 is on the oxygen exchange layer 134.

Referring to structures 152 and 153, in an embodiment, an RRAM element includes a first electrode layer 122. A resistance switching layer 126 is on the first electrode layer 122, the resistance switching layer including a first or primary metal oxide material layer 126 on the first electrode layer 122. A second metal oxide material layer 124 is on the first metal oxide material layer 126. In one embodiment, the second metal oxide material layer 124 includes a metal species not included in the first metal oxide material layer 126. An oxygen exchange layer 134 is on the second metal oxide material layer 124 of the resistance switching layer. A second electrode layer 132 is on the oxygen exchange layer 134.

In an embodiment, referring again to structures 152 and 153, the first metal oxide material layer 126 is selected from the group consisting of a hafnium oxide layer and a zirconium oxide layer. In an embodiment, the second metal oxide material layer 124 is selected from the group consisting of a titanium oxide layer and a tantalum oxide layer. In a specific embodiment, the first metal oxide material layer 126 is a hafnium oxide layer, and the second metal oxide material layer 124 is a titanium oxide layer.

In a particular embodiment, referring to structure 152 of FIG. 1C, the resistance switching layer 126/124 has a thickness of approximately 30 Angstroms. The hafnium oxide layer 126 has a thickness of approximately 28 Angstroms. The titanium oxide layer 124 has a thickness of approximately 2 Angstroms.

In another particular embodiment, referring to structure 153 of FIG. 1C, the resistance switching layer 126/124 has a thickness of approximately 30 Angstroms. The hafnium oxide layer 126 has a thickness of approximately 25 Angstroms. The titanium oxide layer 124 has a thickness of approximately 5 Angstroms.

Referring to structures 154 and 155, in another embodiment, an RRAM element includes a first electrode layer 122. A resistance switching layer on the first electrode layer 122. The resistance switching layer include a first or primary metal oxide material layer 126 on the first electrode layer 122. One or more second or secondary metal oxide material layers 124 is within the first metal oxide material layer 126 (three second or secondary metal oxide material layers 124 are shown for both structures 154 and 155). In an embodiment, the second metal oxide material layer 124 includes a metal species not included in the first metal oxide material layer 126. An oxygen exchange layer 134 is on the first metal oxide material layer 126 of the resistance switching layer. A second electrode layer 132 is on the oxygen exchange layer.

In an embodiment, referring again to structures 154 and 155, the first metal oxide material layer 126 is selected from the group consisting of a hafnium oxide layer and a zirconium oxide layer. In an embodiment, the one or more second metal oxide material layers 124 are or more titanium oxide layers or one or more tantalum oxide layers. In a specific embodiment, the first metal oxide material layer 126 is a hafnium oxide layer, and the one or more second metal oxide material layer 124 are one or more titanium oxide layers. In an embodiment, the resistance switching layer 126/124 has a thickness of approximately 30 Angstroms.

In a particular embodiment, referring to structure 154 of FIG. 1C, the resistance switching layer 154/155 has a concentration ratio of approximately 95:5 of the hafnium oxide layer 126 to the one or more titanium oxide layers 124. In another particular embodiment, referring to structure 155 of FIG. 1C, the resistance switching layer 154/155 has a concentration ratio of approximately 90:10 of the hafnium oxide layer 126 to the one or more titanium oxide layers 124.

Figure 2:
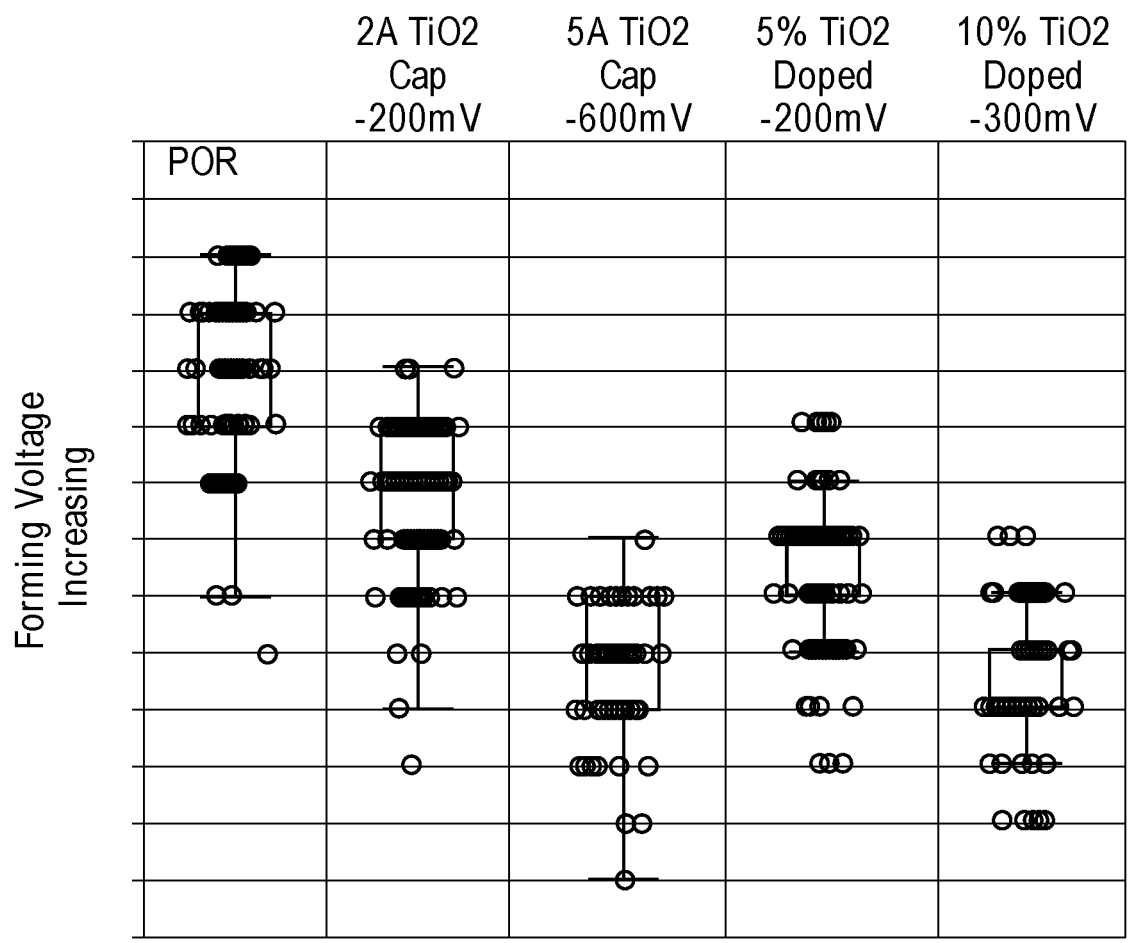
FIG. 2 is a plot of forming voltage measurements for a conventional RRAM element and exemplary RRAM elements having reduced forming voltage, in accordance with an embodiment of the present disclosure.

FIG. 2 is a plot of forming voltage measurements for a conventional RRAM element and exemplary RRAM elements having reduced forming voltage, in accordance with an embodiment of the present disclosure. Referring to FIG. 2, from left to right, forming voltage for exemplary RRAM stacks 150, 152, 153, 154 and 155 of FIG. 1C are plotted. The forming voltages reveal that the structures 152, 153, 154 and 155 including both primary and secondary metal oxide material layers have lower forming voltage than the conventional RRAM stack 150 having a single metal oxide material layer.

It is to be appreciated that the RRAM element 120 may be fabricated on a conductive interconnect formed in an inter-layer dielectric (ILD) layer. It is also to be appreciated that a stack of materials for an RRAM element may ultimately be etched to provide a patterned material stack for the RRAM element. As a possible example of both such scenarios, FIG. 3A illustrates a cross-sectional view of two RRAM devices, in accordance with an embodiment of the present disclosure.

Figure 3A:
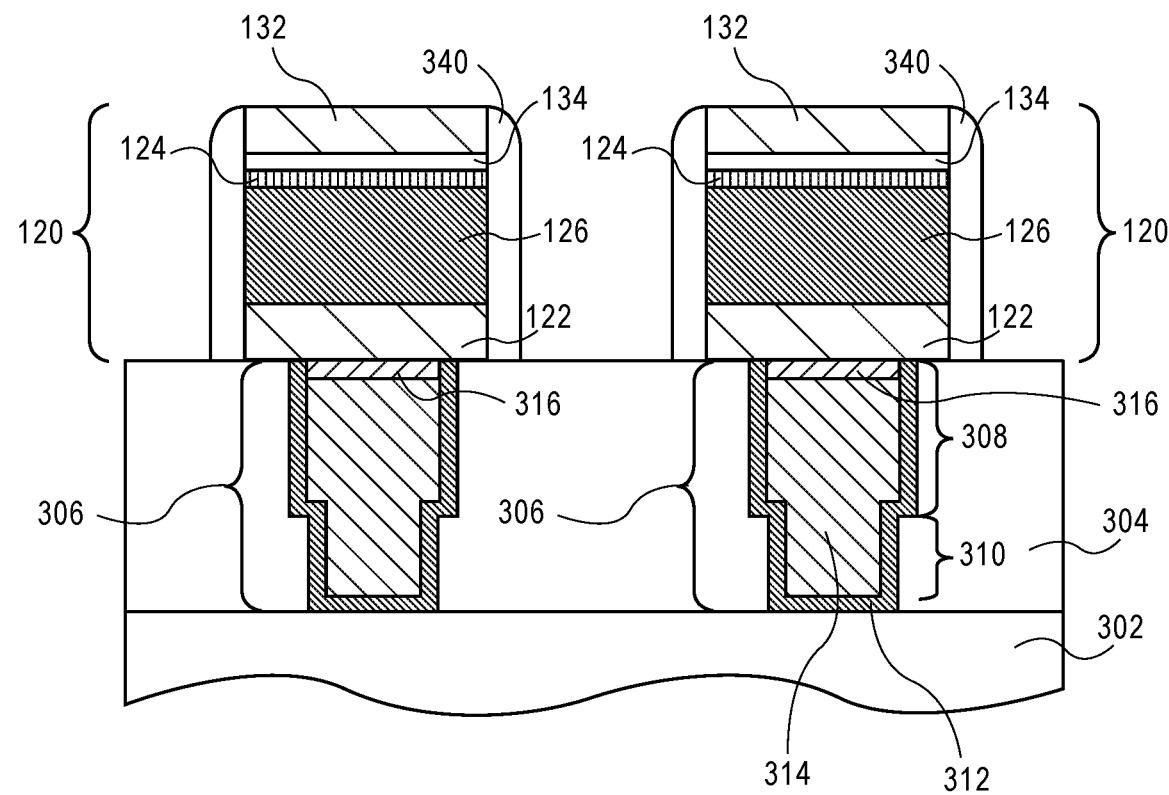
FIG. 3A illustrates a cross-sectional view of two RRAM devices, in accordance with an embodiment of the present disclosure.

Referring to FIG. 3A, each of the resistive random access memory (RRAM) devices includes a conductive interconnect 306 disposed in an inter-layer dielectric (ILD) layer 304 disposed above a substrate 302. The ILD layer 306 has an uppermost surface substantially co-planar with an uppermost surface of the conductive interconnect 306. An RRAM element 120 is disposed on the conductive interconnect 306. Each RRAM element 120 includes the material layers described in association with FIG. 1B or 1C, where the example of 1B is depicted in FIG. 3A.

In an embodiment, the conductive interconnect 306 includes a conductive line portion 308 and an underlying via portion 310, as is depicted in FIG. 3A. In another embodiment, the conductive interconnect is a conductive via. In one embodiment, the conductive interconnect includes a conductive fill material 314 surrounded by a barrier layer 312, which may include an upper barrier layer 316, as is depicted in FIG. 3A. In a specific such embodiment, the conductive fill material 314 but not the barrier layer 312 is recessed to form an opening in which the upper barrier layer 316 is then formed. In an embodiment, although depicted using different shading, the upper barrier layer 316 is composed of substantially the same material as barrier layer. In one such embodiment, the material includes tantalum nitride.

Referring again to FIG. 3A, in an embodiment, the materials of the memory (RRAM) elements are patterned following a deposition process. In one such embodiment, the material layers are patterned using a subtractive etching process. As depicted in FIG. 3A, a dielectric sidewall spacer 340 is laterally adjacent to and in contact with sidewalls of the patterned material layers of stacks 120. In one such embodiment, the dielectric sidewall spacer 340 formation includes conformal deposition of a dielectric material, such as a silicon nitride layer, and subsequent anisotropic etching to form the dielectric sidewall spacer 340. Thus, in one embodiment, a dielectric sidewall spacer 340 is formed laterally adjacent to and in contact with sidewalls of the first electrode layer 122, the second metal oxide material layer 124 of the resistance switching layer 126, the first metal oxide material layer 126 of the resistance switching layer, the optional oxygen exchange layer 134 (if present), and the second electrode layer 132.

Referring again to FIG. 3A, and as used throughout the present disclosure, in an embodiment, one or more interlayer dielectrics (ILDs), such as ILD layer 304, are included in an RRAM device structure. Such ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. In cases where a stack of ILD layers is implemented, etch stop materials may be included as intervening dielectric layers between the ILD layers. Such etch stop layers may be composed of dielectric materials different from the interlayer dielectric material. In some embodiments, an etch stop layer includes a layer of a nitride of silicon (e.g., silicon nitride) or a layer of an oxide of silicon, or both, or a combination thereof. Other suitable materials may include carbon-based materials, such as silicon carbide. Alternatively, other etch stop layers known in the art may be used depending upon the particular implementation. The etch stop layers may be formed by CVD, PVD, or by other deposition methods.

Referring again to FIG. 3A, and as used throughout the present disclosure, in an embodiment, the metal lines (such as 308) and vias (such as 310) are composed of one or more metal or other conductive structures. A common example is the use of copper lines and structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

Referring again to FIG. 3A, and as used throughout the present disclosure, in an embodiment, substrate 302 is a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

It is to be appreciated that the layers and materials described in association with FIG. 1B, 1C or 3A, and as used throughout the present disclosure, are typically formed on or above an underlying semiconductor substrate or structure, such as underlying device layer(s) of an integrated circuit. In an embodiment, an underlying semiconductor substrate 121 or 302 represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. In one embodiment, the illustrated structure depicted in FIG. 1B, 1C or 3A is fabricated on underlying transistor or other semiconductor device layer(s) formed in or above the substrate 121 or 302. In another embodiment, the illustrated structures depicted in FIG. 1B, 1C or 3A are fabricated on underlying lower level interconnect layers formed above the substrate 121 or 302, respectively.

In an aspect, RRAM elements 120 may be formed on a common conductive line. As an example, FIG. 3B illustrates a plan view of a pair of RRAM elements integrated with a common line electrode, in accordance with an embodiment of the present disclosure.

Figure 3B:
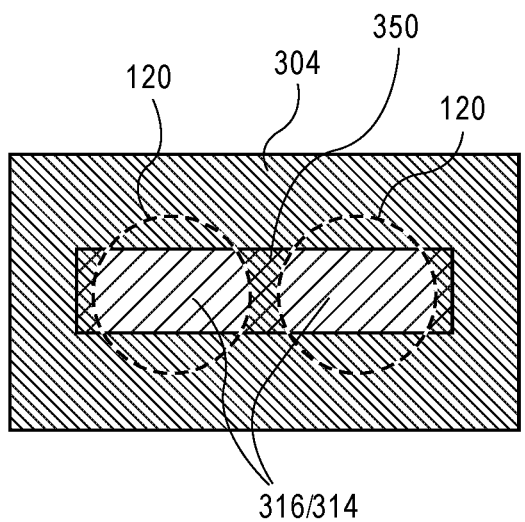
FIG. 3B illustrates a plan view of a pair of RRAM elements integrated with a common line electrode, in accordance with an embodiment of the present disclosure.

Referring to FIG. 3B, a conductive interconnect 350 housed in an ILD layer 304 includes two RRAM stacks 120 thereon (e.g., stacks including layers described in association with FIG. 1B, 1C or 3A). Each RRAM stack 120 is disposed on a portion of an upper barrier layer 316 or a conductive fill material 314 of the conductive interconnect. The conductive interconnect in this example is a conductive line coupled to a first and second RRAM stacks 120.

In another aspect, adjacent RRAM elements 120 may be formed on respective conductive vias. As an example, FIG. 3C illustrates a plan view of a pair of RRAM elements integrated with discrete via electrodes, in accordance with an embodiment of the present disclosure.

Figure 3C:
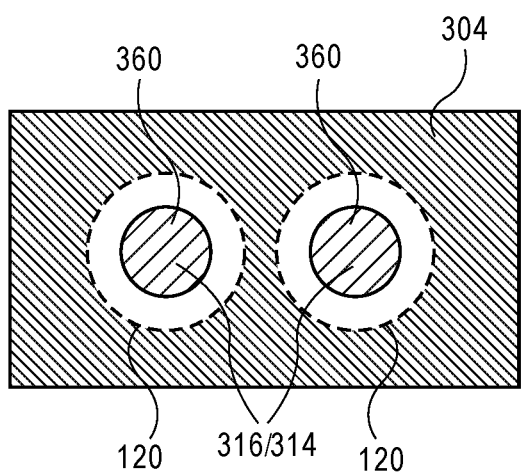
FIG. 3C illustrates a plan view of a pair of RRAM elements integrated with discrete via electrodes, in accordance with an embodiment of the present disclosure.

Referring to FIG. 3C, a pair of conductive vias 360 housed in an ILD layer 304 each has a respective RRAM stack 120 thereon (e.g., stacks including layers described in association with FIG. 1B, 1C or 3A)). Each via is discrete and includes an exposed upper barrier layer 316 or conductive fill material 314, on which a corresponding RRAM stack 120 is disposed.

The above described RRAM material stacks may be fabricated through subtractive patterning of the layers of the RRAM stack 120 materials. In another aspect, however, the layers of an RRAM element may be fabricated in a damascene-like fabrication scheme. As an example, FIG. 4 illustrates a cross-sectional view of an RRAM device fabricated using a damascene process, in accordance with an embodiment of the present disclosure.

Figure 4:
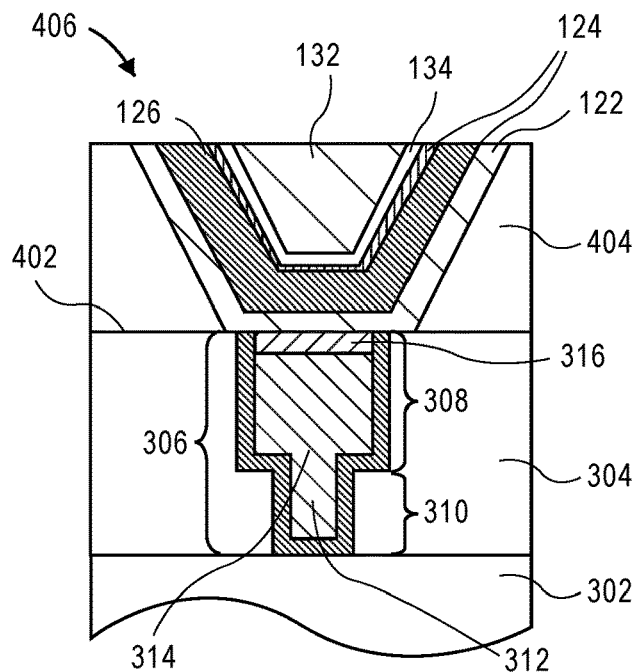
FIG. 4 illustrates a cross-sectional view of an RRAM device fabricated using a damascene process, in accordance with an embodiment of the present disclosure.

Referring to FIG. 4, a resistive random access memory (RRAM) device includes a conductive interconnect 306 (e.g., one such interconnect described in association with FIG. 3A) disposed in a first inter-layer dielectric (ILD) layer 304 disposed above a substrate 302. A second ILD layer 404 is disposed above the first ILD layer 304. The second ILD layer 404 has an opening exposing the conductive interconnect 306 from a top down perspective. The opening has sidewalls, for example the sloped sidewalls depicted in FIG. 4.

An RRAM element 406 is disposed on the conductive interconnect 306. The RRAM element 406 includes materials of the first electrode layer 122, the first metal oxide material layer 126 of a resistance switching layer, the second metal oxide material layer 124 of the resistance switching layer, the optional oxygen exchange layer 134 (if present), and the second electrode layer 132 formed in the opening of the second ILD layer 404. In one embodiment, second ILD layer 404 is disposed directly on an uppermost surface 402 of the first ILD layer 304, as is depicted in FIG. 4. In another embodiment, an etch stop layer is disposed between the first ILD layer 304 and the second ILD layer 404.

Figure 5:
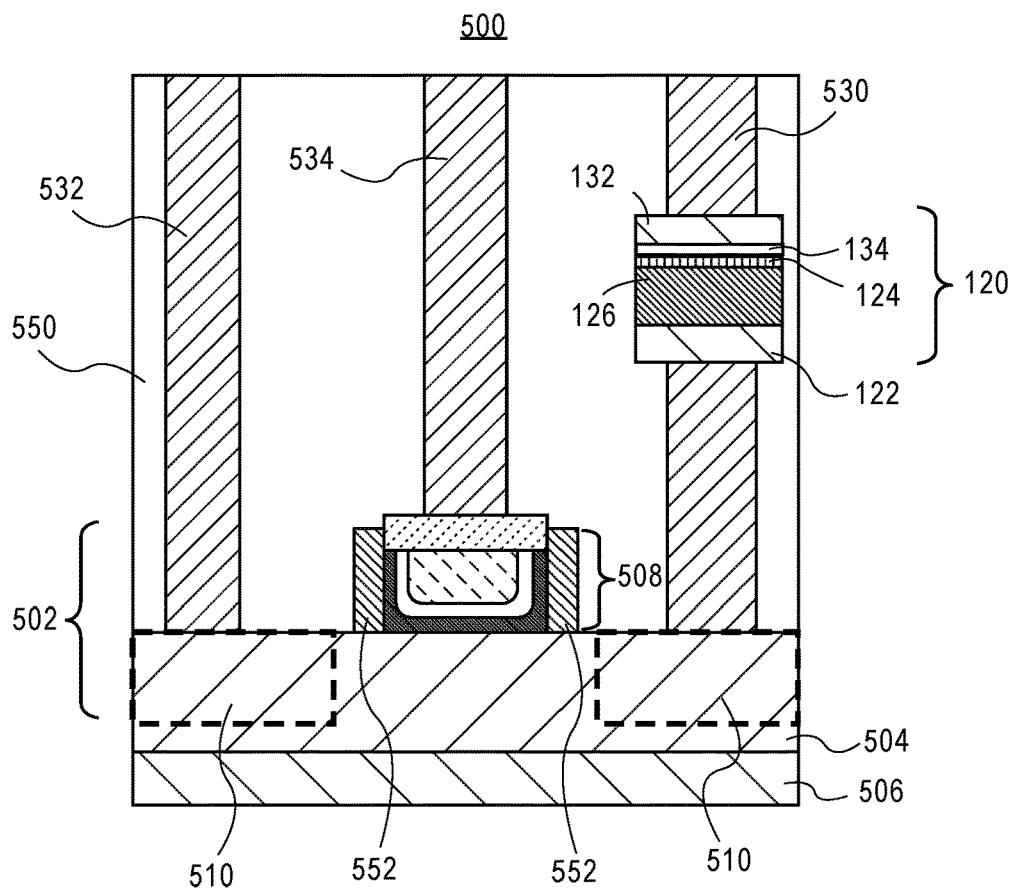
FIG. 5 illustrates a cross-sectional view of an RRAM element coupled to a drain side of a transistor selector, in accordance with an embodiment of the present disclosure.

Referring to FIG. 5, a memory structure 500 includes a transistor 502 disposed in or above an active region 504 of a semiconductor substrate 506. The transistor 502 includes a gate electrode 508 with source/drain regions 510 on either side of the gate electrode 508, and in active region 504 of substrate 506. In an embodiment, the source/drain region 510 on the left-hand side of FIG. 5 is a source region, and the source/drain region 510 on the right-hand side of FIG. 5 is a drain region. An RRAM element 120 is coupled to the drain region of the transistor 502, but not to the source region of the transistor 502. The arrangement enables driving of the RRAM element 120 by the drain side only. The RRAM element 120 and portions of the transistor 502 may be included in an inter-layer dielectric (ILD) layer 550, as is depicted in FIG. 5.

The RRAM element 120 includes a top (second) electrode layer 132, an optional oxygen exchange layer 134 (if present), a second or secondary metal oxide material layer 124 of a resistance switching layer, a first or primary metal oxide material layer 126 of the resistance switching layer, and a bottom (first) electrode layer 122. The RRAM element 120 is, in an embodiment, included as an interrupting feature along a conductive drain contact 530. In one such embodiment, corresponding gate contact 534 and source contact 532 are not coupled to, or interrupted by the RRAM element 120, as is depicted in FIG. 5. It is to be appreciated that although the RRAM element 120 is shown generically along the drain contact 530 without a lateral reference, the actual layer in which the RRAM element 120 is included may be viewed as an interconnect layer (e.g., M1, M2, M3, M4, etc.) corresponding to a logic region in another area of the substrate 506. It is also to be appreciated that additional interconnect layer(s) may be formed on top of the structure 500 shown in FIG. 5, e.g., using standard dual damascene process techniques that are well-known in the art.

In an embodiment, transistor 502 is a metal-oxide-semiconductor field-effect transistor (MOSFET or simply MOS transistor), fabricated on a substrate. In various implementations of the disclosure, the MOS transistors described herein may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer of each MOS transistor is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers 552 may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

To provide further context, integrating memory directly onto a microprocessor chip would be advantageous since it enables higher operation speeds compared to having physically separate logic and memory chips. Unfortunately, traditional charge-based memory technologies such as DRAM and NAND Flash are now facing severe scalability issues related to increasingly precise charge placement and sensing requirements. As such, embedding charge-based memory directly onto a high performance logic chip is not very attractive for future technology nodes. However, a memory technology that does have the potential to scale to much smaller geometries compared to traditional charge-based memories is resistive random access memory (RRAM), since it relies on resistivity rather than charge as the information carrier. However, in order to exploit the potential benefits of a high performance logic chip with embedded RRAM memory, an appropriate integrated logic plus RRAM structure and fabrication method is needed. Embodiments of the present disclosure include such structures and fabrication processes.

Relating to one or more embodiments described herein, it is to be appreciated that traditional DRAM memory is facing severe scaling issues and, so, other types of memory devices are being actively explored in the electronics industry. One future contender is RRAM devices. Embodiments described herein include a fabrication method for embedding RRAM bit cell arrays into a logic process technology. Embodiments described may be advantageous for processing schemes involving the fabrication of logic processors with embedded memory arrays.

In an aspect, an RRAM element may be included in an integrated circuit in regions typically referred to as back end or back end of line (BEOL) layers of the integrated circuit. As examples, FIG. 6A illustrates schematic views of several options for positioning an RRAM element in an integrated circuit, in accordance with an embodiment of the present disclosure.

Figure 6A:
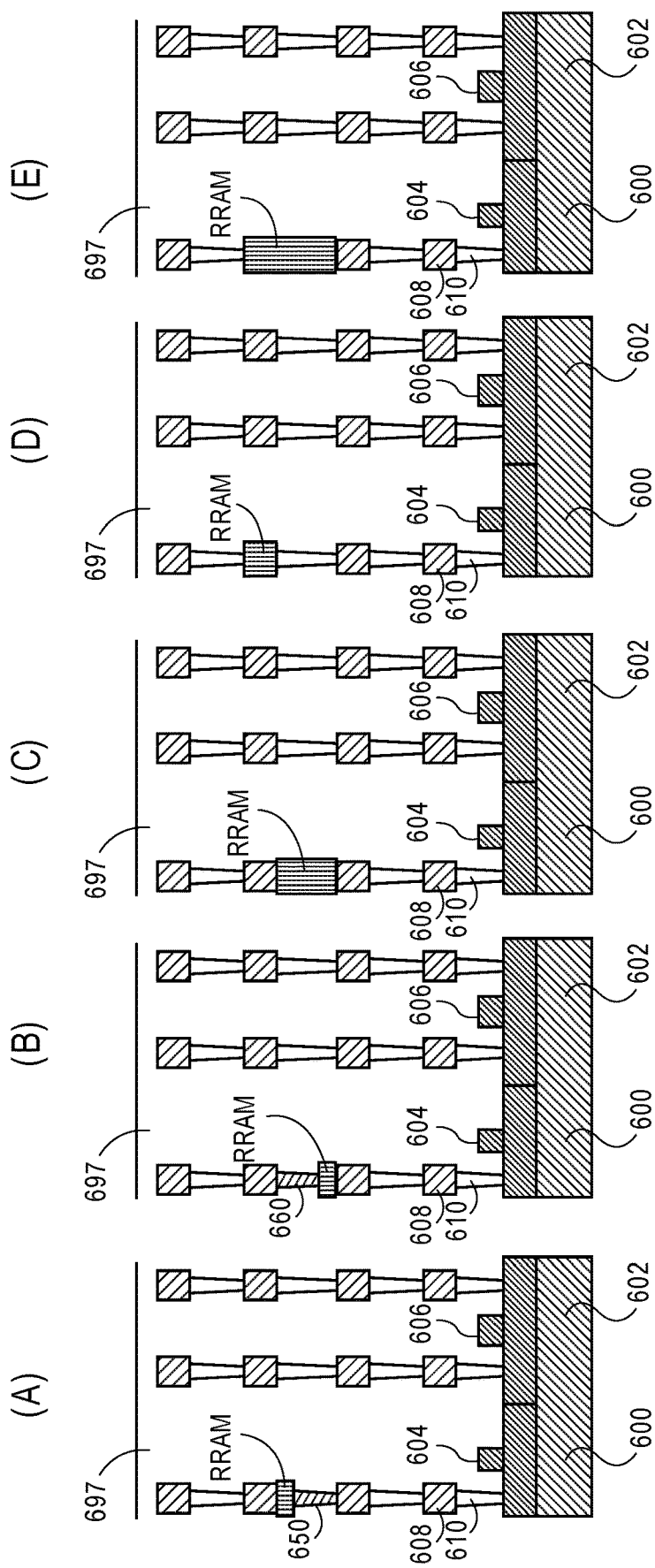
FIG. 6A illustrates schematic views of several options for positioning an RRAM element in an integrated circuit, in accordance with an embodiment of the present disclosure.

Referring to FIG. 6A, five examples (A)-(E) of an RRAM cell situated above a second metal logic layer (M2) or higher are provided. In each case, a memory region 600 and a logic region 602 of an integrated circuit are depicted schematically. Each memory region 600 and logic region 602 is associated with a corresponding transistor (or group of transistors) 604 or 606, respectively. Stacks of metallization layers (as housed in encompassing dielectric layer or layers 697) include metal lines 608 and vias 610 that are generally alternating. Thus, all arrangements depicted include an RRAM element disposed above a second metal line (M2) in the stack. The RRAM element typically includes a resistance switching layer sandwiched between a bottom electrode and a top electrode, and may be formed in an opening of an insulating layer. In accordance with an embodiment of the present disclosure, the resistance switching layer includes at least two different metal oxide layers of differing composition. The described arrangements can enable integration of both logic and memory on a same die versus stand-alone memory. Although depicted at a very high level conceptual view for the sake of illustrating general placement options, it is to be appreciated that, in accordance with an embodiment of the present disclosure, elements labeled RRAM in FIG. 6A includes a stack of multiple layers such as those described above.

Referring again to FIG. 6A, in a first example (A), an RRAM element is fabricated on top of a unique via 650 intended for memory devices. In a second example (B), an RRAM element is fabricated first and an upper unique via 660 contacts the RRAM from above. In a third example (C), an RRAM element has a top electrode with an increased thickness such that the RRAM element occupies a full via depth, between metal lines. In a fourth example (D), an RRAM element has a top electrode with an increased thickness such that the RRAM element occupies a full metal line height. In a fifth example (E), an RRAM element has a top electrode with an increased thickness such that the RRAM element occupies a full interconnect level (via plus metal line). Accordingly, in an embodiment, an RRAM element or an array of RRAM elements can be embedded in a logic chip.

Figure 6B:
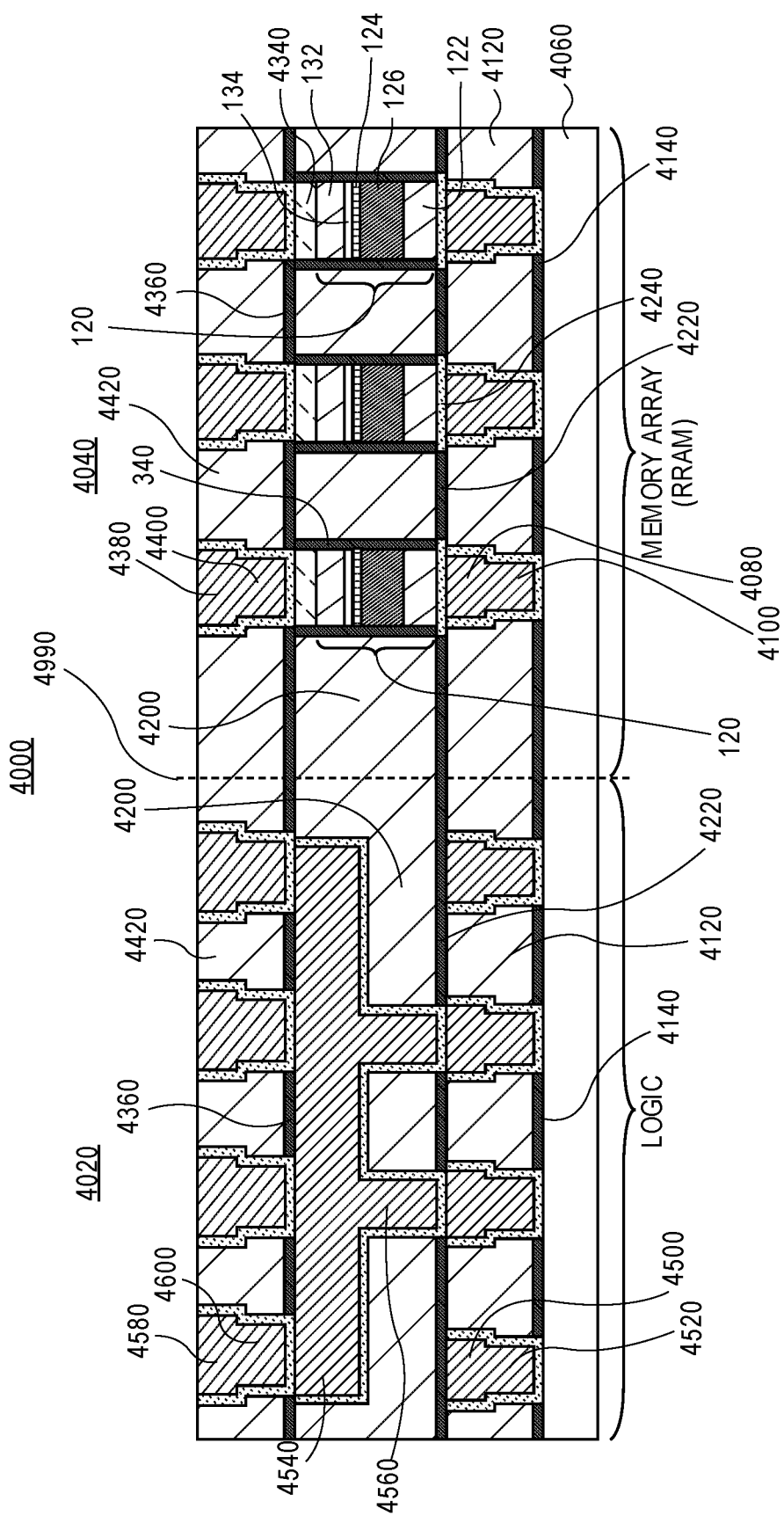
FIG. 6B illustrates a cross-sectional view of a logic region together with an RRAM memory array integrated on a common substrate, in accordance with an embodiment of the present disclosure.

An RRAM array may be embedded in a logic chip. As an example, FIG. 6B illustrates a cross-sectional view of a logic region together with an RRAM memory array integrated on a common substrate, in accordance with an embodiment of the present disclosure. Referring to FIG. 6B, a structure 4000 includes a logic region 4020 and an RRAM array region 4040.

Referring to the RRAM array region 4040 of FIG. 6B, in a first layer, metal 2 (M2) 4080 and via 1 (V1) 4100 structures are formed above a substrate 4060. The M2 4080 and V1 4100 structures are formed in an inter-layer dielectric layer 4120 disposed over an etch stop layer 4140.

Referring again to the RRAM array region 4040 of FIG. 6B, in a second layer, a plurality of RRAM stacks 120 is formed in the inter-layer dielectric layer 4200 disposed over the etch stop layer 4220. The plurality of RRAM stacks 120 may be coupled to corresponding ones of the M2 4080 structures by a conductive layer 4240, as is depicted in FIG. 6B. A dielectric spacer layer 340 may be formed on sidewalls of portions of the RRAM stacks, as is also depicted in FIG. 6B. In the exemplary embodiment, each of the RRAM stacks 120 includes a first electrode layer 122, a resistance switching layer having a first metal oxide material layer 126 and a second metal oxide material layer 124, an optional oxygen exchange layer 134 (if present), and a second electrode layer 132. A top electrode 4340 may also be included, as is depicted in FIG. 6B.

Referring again to the RRAM array region 4040 of FIG. 6B, in a third layer, an etch stop layer 4360 is disposed on the inter-layer dielectric layer 4200. Metal 4 (M4) 4380 and via to memory 4400 structures are formed in the inter-layer dielectric layer 4420 disposed over the etch stop layer 4360. It is to be appreciated that additional interconnect layer(s) may be formed on top of the M4/via to memory layers of the RRAM array region 4040 of FIG. 6B, e.g., using standard dual damascene process techniques that are well-known in the art.

It is to be appreciated that although the RRAM stacks may actually include numerous layers of very thin films, for the sake of simplicity the RRAM stacks 120 are depicted as describe above. It is also to be appreciated that although in the illustrations the RRAM stacks are shown embedded into a corresponding logic metal 3 (M3) layer, they may instead be embedded into some other interconnect layer (e.g., M1, M2, M4, etc.)

Referring again to FIG. 6B, in an embodiment, the conductive metal layer 4240 is a tantalum nitride (TaN) layer. In one embodiment, the conductive metal layer 4240 is referred to as a "thin via" layer. In an embodiment, the top electrode 4340 is composed of a material or stack of materials suitable for electrically contacting the RRAM stack 120. In an embodiment, the top electrode 4340 is a topographically smooth electrode. In one such embodiment, the top electrode 4340 has a thickness suitable for good conductivity but has little to no columnar structure formation that would otherwise lead to a rough top surface. Such a topographically smooth electrode may be referred to as amorphous in structure. In an embodiment, the top electrode 4340 begins as a hardmask layer, such as a titanium nitride hardmask layer, used for patterning the RRAM stack and is ultimately retained as a conductive contact.

Referring now to the logic region 4020 of FIG. 6B, in the first layer, metal 2 (M2) 4500 and via 1 (V1) 4520 structures are formed in the inter-layer dielectric layer 4120 disposed over the etch stop layer 4140. In the second layer, the etch stop layer 4220 is disposed on the inter-layer dielectric layer 4120. Metal 3 (M3) 4540 and via 2 (V2) 4560 structures are formed in the inter-layer dielectric layer 4200 disposed over the etch stop layer 4220. In the third layer, the etch stop layer 4360 is disposed on the inter-layer dielectric layer 4200. Metal 4 (M4) 4580 and via 3 (V3) 4600 structures are formed in the inter-layer dielectric layer 4420 disposed over the etch stop layer 4360. It is to be appreciated that additional interconnect layer(s) may be formed on top of the M4/V3 layers of the logic region 4020 of FIG. 6B, e.g., using standard dual damascene process techniques that are well-known in the art.

In another aspect, upon fabrication of an RRAM element associated with an insulating metal oxide material layer, the RRAM may be subjected to an intentional one-time "breakdown" process for filament formation in the resulting RRAM device fabricated from the RRRAM memory element. To illustrate the above aspect, FIGS. 7A and 7B illustrate a schematic and corresponding I-V plot, respectively, demonstrating concepts involved with filament formation in an RRAM element, in accordance with an embodiment of the present disclosure.

Figure 7A:
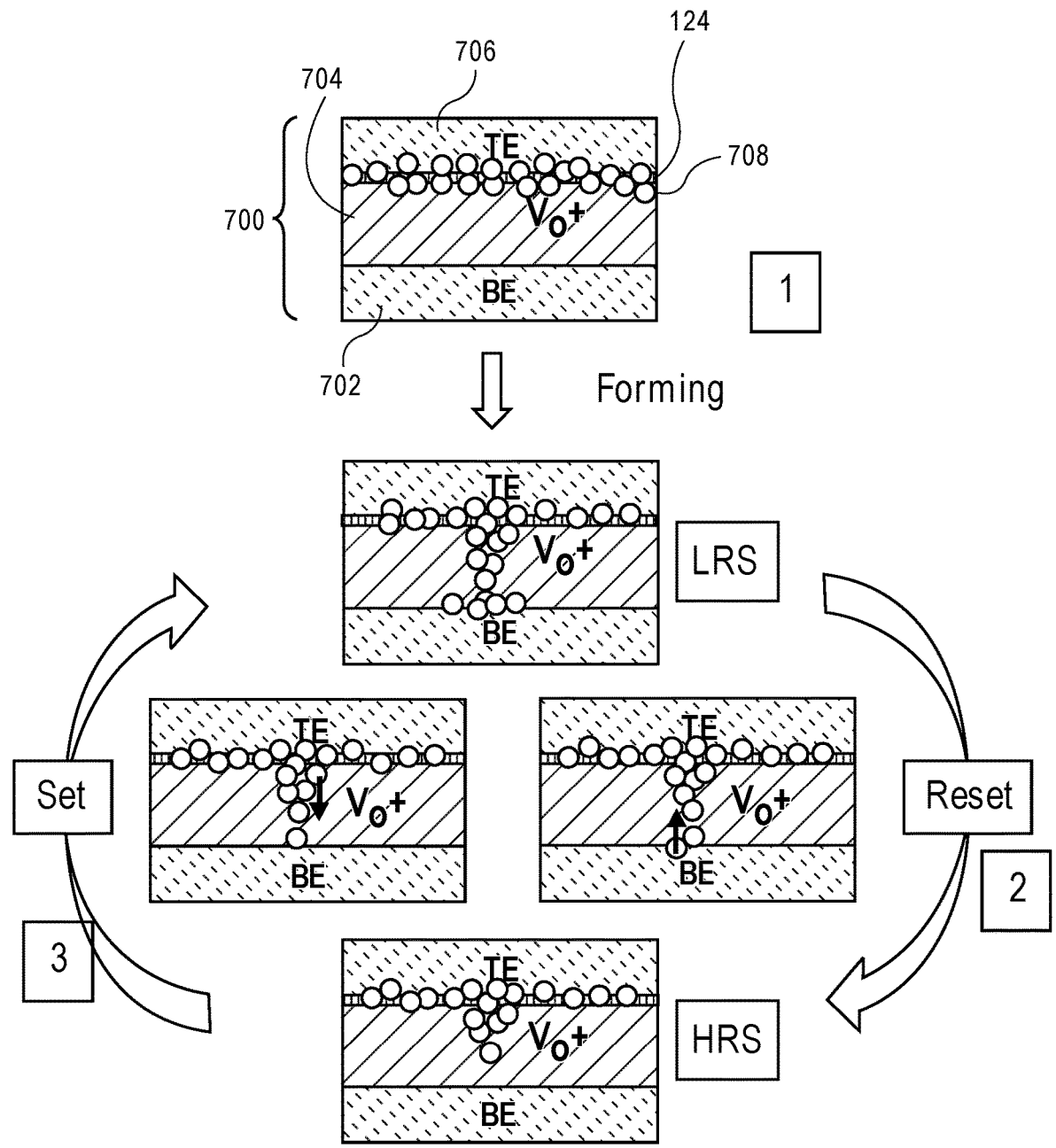
FIGS. 7A and 7B illustrate a schematic and corresponding I-V plot, respectively, demonstrating concepts involved with filament formation in an RRAM element, in accordance with an embodiment of the present disclosure.
Figure 7B:
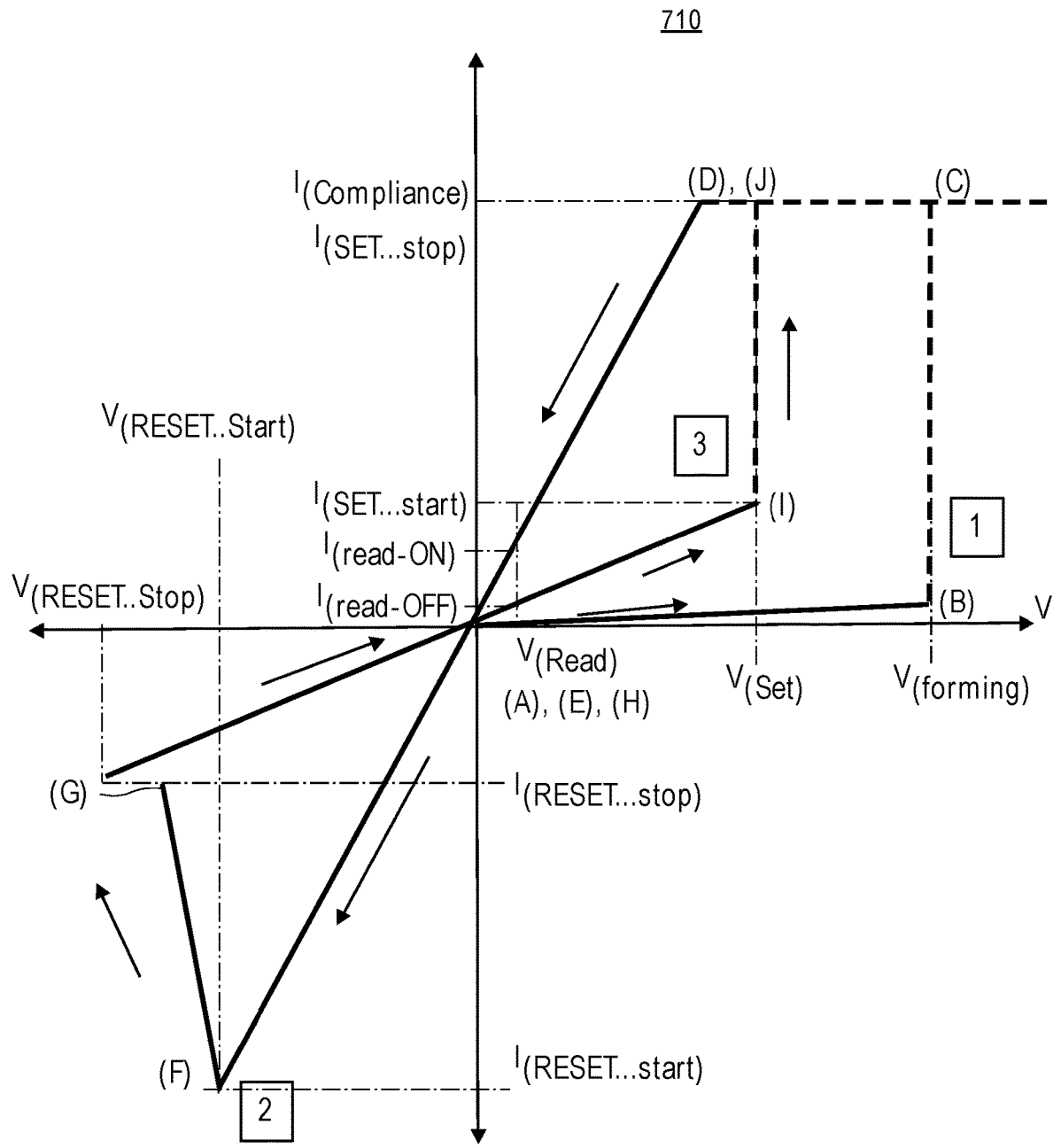

Referring to FIG. 7A, a material stack 700 includes a bottom electrode (BE) 702, a first oxide layer 704 such a hafnium oxide layer (HfO2), a second oxide layer 124 such as a titanium oxide layer, and a top electrode (TE) 706. Oxide vacancies 708 may are depicted as circles in FIG. 7A. Oxide RRAM cell filament formation begins with a stoichiometric oxide layer 704 which is subjected to a forming (soft breakdown) operation (1) to provide a low resistance state (LRS). A first reset operation (2) is then performed to provide switching to a high resistance state (HRS). A set operation (3) is then performed to return to the LRS. Performing operations (1)-(3) involves motion of oxygen vacancies and redox phenomena. Plot 710 of FIG. 7B illustrates the I-V characteristics association with operations (1), (2) and (3) of FIG. 7A.

Figure 8:
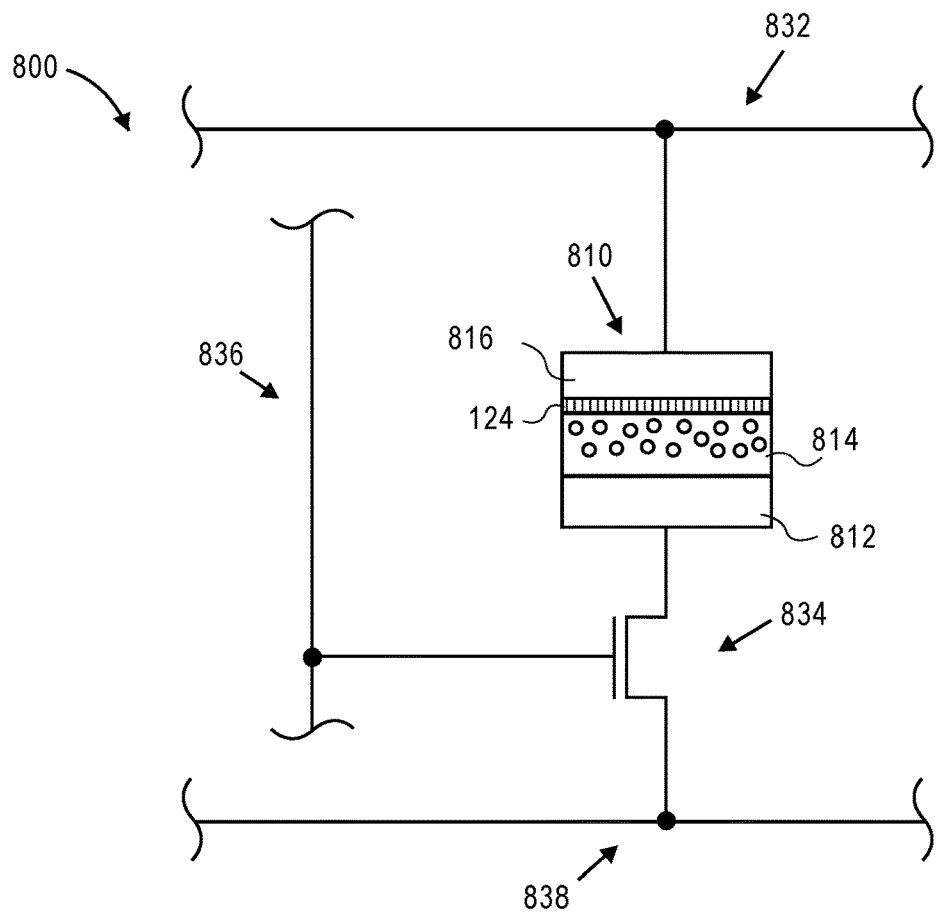
FIG. 8 illustrates a schematic of a memory bit cell which includes an RRAM memory element, in accordance with an embodiment of the present disclosure.

FIG. 8 illustrates a schematic of a memory bit cell 800 which includes an RRAM memory element 810, in accordance with an embodiment of the present disclosure. Such an RRAM memory element may be suitable for manufacture on a substrate in common with logic regions of the substrate.

Referring to FIG. 8, the RRAM memory element 810 may include a first conductive electrode 812, and a resistive switching element including a first metal oxide material layer 814 and a second metal oxide material layer 124. A second conductive electrode 816 is adjacent the resistive switching element. The second conductive electrode 816 may be electrically connected to a bit line 832. The first conductive electrode 812 may be coupled with a transistor 834. The transistor 834 may be coupled with a wordline 836 and a source line 838 in a manner that will be understood to those skilled in the art. The memory bit cell 800 may further include additional read and write circuitry (not shown), a sense amplifier (not shown), a bit line reference (not shown), and the like, as will be understood by those skilled in the art, for the operation of the memory bit cell 800. It is to be appreciated that a plurality of the memory bit cells 800 may be operably connected to one another to form a memory array, wherein the memory array can be incorporated into a non-volatile memory region of a substrate in common with a logic region. It is to be appreciated that the transistor 834 may be connected to the second conductive electrode 816 or the first conductive electrode 812, although only the latter is shown.

Figure 9:
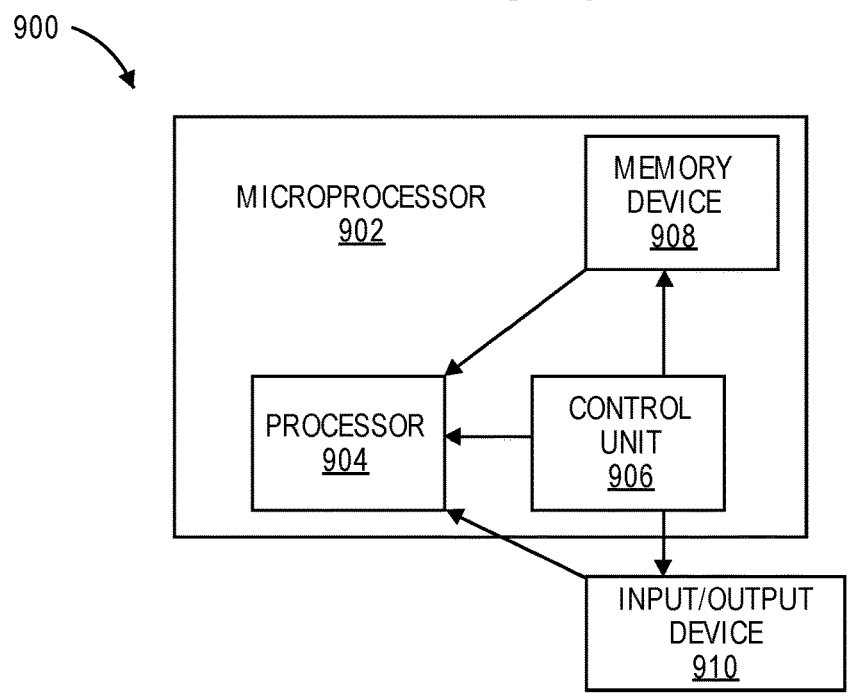
FIG. 9 illustrates a block diagram of an electronic system, in accordance with an embodiment of the present disclosure.

FIG. 9 illustrates a block diagram of an electronic system 900, in accordance with an embodiment of the present disclosure. The electronic system 900 can correspond to, for example, a portable system, a computer system, a process control system, or any other system that utilizes a processor and an associated memory. The electronic system 900 may include a microprocessor 902 (having a processor 904 and control unit 906), a memory device 908, and an input/output device 910 (it is to be appreciated that the electronic system 900 may have a plurality of processors, control units, memory device units and/or input/output devices in various embodiments). In one embodiment, the electronic system 900 has a set of instructions that define operations which are to be performed on data by the processor 904, as well as, other transactions between the processor 904, the memory device 908, and the input/output device 910. The control unit 906 coordinates the operations of the processor 904, the memory device 908 and the input/output device 910 by cycling through a set of operations that cause instructions to be retrieved from the memory device 908 and executed. The memory device 908 can include a memory element having resistive switching element and electrode stack as described in the present description. In an embodiment, the memory device 908 is embedded in the microprocessor 902, as depicted in FIG. 9. In an embodiment, the processor 904, or another component of electronic system 900, includes an array of RRAM devices, each having first and second metal oxide material layers of differing composition.

Figure 10:
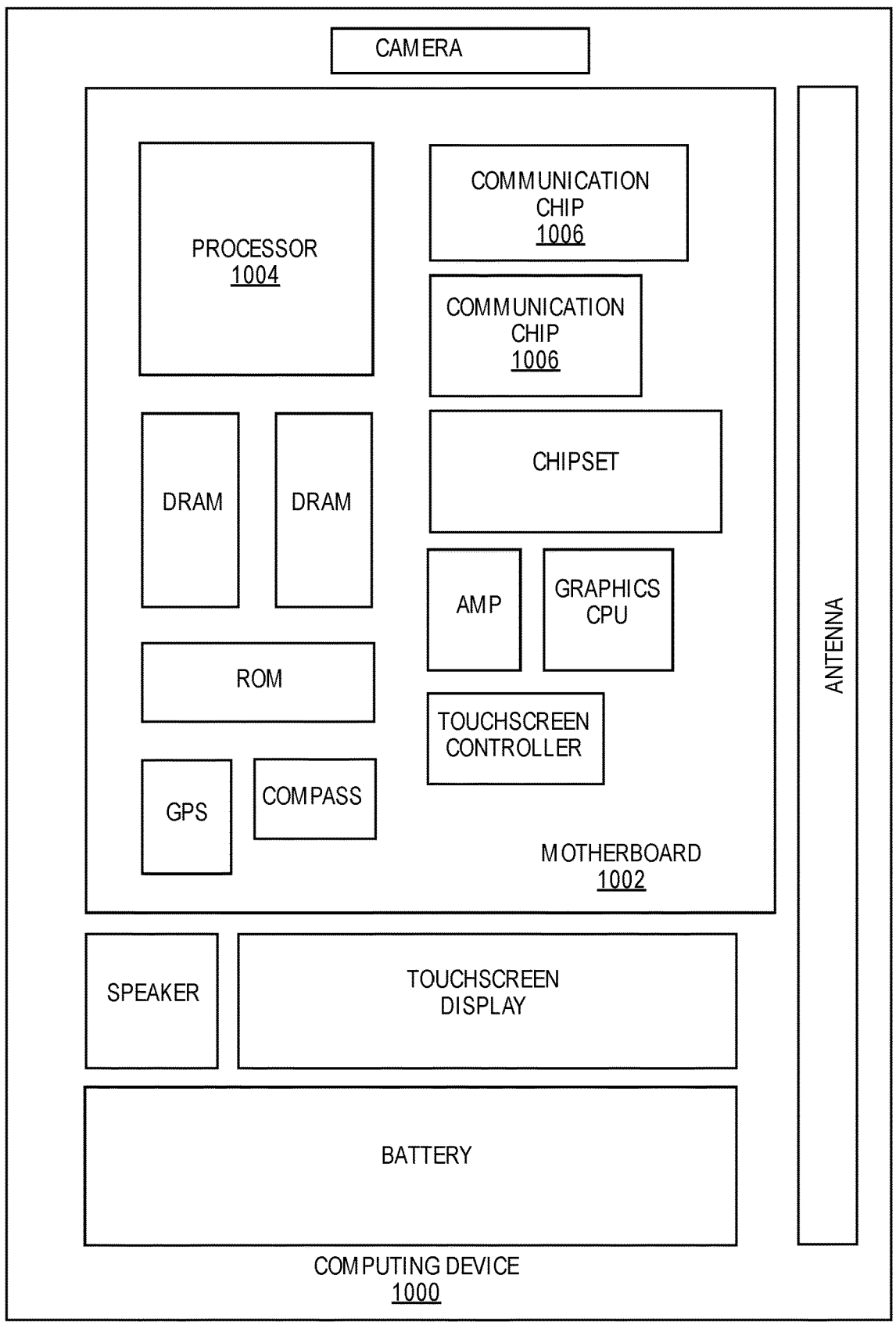
FIG. 10 illustrates a computing device in accordance with one embodiment of the disclosure.

FIG. 10 illustrates a computing device 1000 in accordance with one embodiment of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of embodiments of the disclosure, the integrated circuit die of the processor includes one or more arrays, such as RRAM memory arrays integrated into a logic processor, built in accordance with embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of an embodiment of the disclosure, the integrated circuit die of the communication chip includes RRAM memory arrays integrated into a logic processor, built in accordance with embodiments of the present disclosure.

In further implementations, another component housed within the computing device 1000 may contain a stand-alone integrated circuit memory die that includes one or more arrays, such as RRAM memory arrays integrated into a logic processor, built in accordance with embodiments of the present disclosure.

In various implementations, the computing device 1000 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of RRAM memory arrays integrated into a logic processor. Such arrays may be used in an embedded non-volatile memory, either for its non-volatility, or as a replacement for embedded dynamic random access memory (eDRAM). For example, such an array may be used for 1T-1R memory or 2T-1R memory (R=resistor, T=transistor) at competitive cell sizes within a given technology node.

Figure 11:
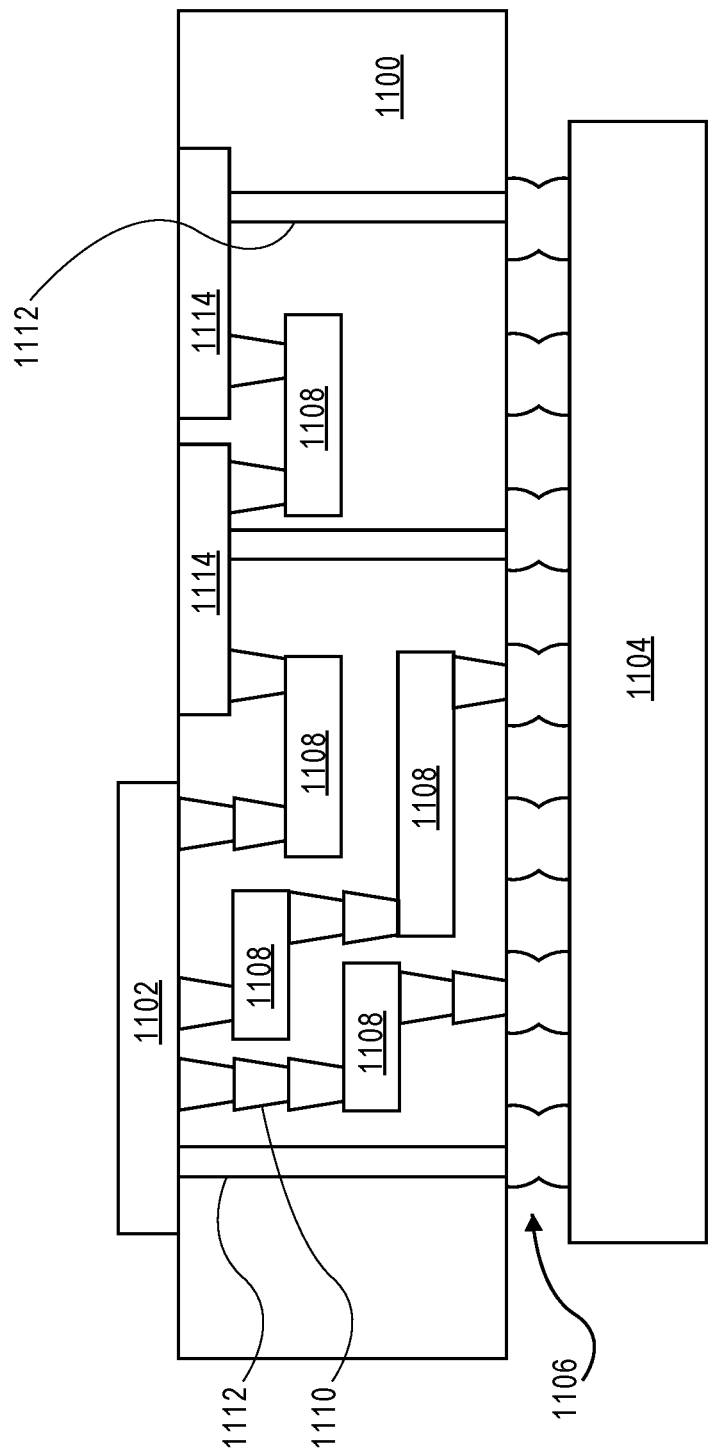
FIG. 11 illustrates an interposer that includes one or more embodiments of the disclosure.

FIG. 11 illustrates an interposer 1100 that includes one or more embodiments of the disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100.

Thus, embodiments of the present disclosure include approaches for fabricating RRAM stacks with reduced forming voltage, and the resulting structures and devices.

Example Embodiment 1

A resistive random access memory (RRAM) device includes a conductive interconnect in an inter-layer dielectric (ILD) layer above a substrate. An RRAM element is on the conductive interconnect, the RRAM element including a first electrode layer on an uppermost surface of the conductive interconnect. A resistance switching layer is on the first electrode layer, the resistance switching layer including a first metal oxide material layer on the first electrode layer, and a second metal oxide material layer on the first metal oxide material layer, the second metal oxide material layer including a metal species not included in the first metal oxide material layer. An oxygen exchange layer is on the second metal oxide material layer of the resistance switching layer. A second electrode layer is on the oxygen exchange layer.

Example Embodiment 2

The RRAM device of example embodiment 1, wherein the first metal oxide material layer is selected from the group consisting of a hafnium oxide layer and a zirconium oxide layer.

Example Embodiment 3

The RRAM device of example embodiment 1 or 2, wherein the second metal oxide material layer is selected from the group consisting of a titanium oxide layer and a tantalum oxide layer.

Example Embodiment 4

The RRAM device of example embodiment 1, wherein the first metal oxide material layer is a hafnium oxide layer, and the second metal oxide material layer is a titanium oxide layer.

Example Embodiment 5

The RRAM device of example embodiment 4, wherein the resistance switching layer has a thickness of approximately 30 Angstroms, the hafnium oxide layer has a thickness of approximately 28 Angstroms, and the titanium oxide layer has a thickness of approximately 2 Angstroms.

Example Embodiment 6

The RRAM device of example embodiment 4, wherein the resistance switching layer has a thickness of approximately 30 Angstroms, the hafnium oxide layer has a thickness of approximately 25 Angstroms, and the titanium oxide layer has a thickness of approximately 5 Angstroms.

Example Embodiment 7

The RRAM device of example embodiment 1, 2, 3, 4, 5 or 6, further including a dielectric sidewall spacer laterally adjacent to and in contact with sidewalls of the second electrode layer, the oxygen exchange layer, the resistance switching layer, and the first electrode layer of the RRAM element.

Example Embodiment 8

The RRAM device of example embodiment 1, 2, 3, 4, 5, 6 or 7, wherein the conductive interconnect is a conductive line further coupled to a second RRAM element.

Example Embodiment 9

The RRAM device of example embodiment 1, 2, 3, 4, 5, 6 or 7, wherein the conductive interconnect is a conductive via.

Example Embodiment 10

The RRAM device of example embodiment 1, 2, 3, 4, 5, 6, 7, 8 or 9, wherein the conductive interconnect is coupled to a drain region of an underlying select transistor in or above the substrate.

Example embodiment 11. A resistive random access memory (RRAM) device includes a conductive interconnect in an inter-layer dielectric (ILD) layer above a substrate. An RRAM element is on the conductive interconnect, the RRAM element including a first electrode layer on the uppermost surface of the conductive interconnect, and a resistance switching layer on the first electrode layer. The resistance switching layer includes a first metal oxide material layer on the first electrode layer, and a second metal oxide material layer within the first metal oxide material layer, the second metal oxide material layer including a metal species not included in the first metal oxide material layer. An oxygen exchange layer is on the first metal oxide material layer of the resistance switching layer. A second electrode layer is on the oxygen exchange layer.

Example Embodiment 12

The RRAM device of example embodiment 11, wherein the first metal oxide material layer is selected from the group consisting of a hafnium oxide layer and a zirconium oxide layer.

Example Embodiment 13

The RRAM device of example embodiment 11, wherein the second metal oxide material layer is selected from the group consisting of a titanium oxide layer and a tantalum oxide layer.

Example Embodiment 14

The RRAM device of example embodiment 11, wherein the first metal oxide material layer is a hafnium oxide layer, and the second metal oxide material layer is a titanium oxide layer.

Example Embodiment 15

The RRAM device of example embodiment 14, wherein the resistance switching layer has a thickness of approximately 30 Angstroms.

Example Embodiment 16

The RRAM device of example embodiment 14 or 15, wherein the resistance switching layer has a concentration ratio of approximately 95:5 of the hafnium oxide layer to the titanium oxide layer.

Example Embodiment 17

The RRAM device of example embodiment 14 or 15, wherein the resistance switching layer has a concentration ratio of approximately 90:10 of the hafnium oxide layer to the titanium oxide layer.

Example Embodiment 18

The RRAM device of example embodiment 11, 12, 13, 14, 15, 16 or 17, further including a dielectric sidewall spacer laterally adjacent to and in contact with sidewalls of the second electrode layer, the oxygen exchange layer, the resistance switching layer, and the first electrode layer of the RRAM element.

Example Embodiment 19

The RRAM device of example embodiment 11, 12, 13, 14, 15, 16, 17 or 18, wherein the conductive interconnect is a conductive line further coupled to a second RRAM element.

Example Embodiment 20

The RRAM device of example embodiment 11, 12, 13, 14, 15, 16, 17 or 18, wherein the conductive interconnect is a conductive via.

Example Embodiment 21

The RRAM device of example embodiment 11, 12, 13, 14, 15, 16, 17, 18, 19 or 20, wherein the conductive interconnect is coupled to a drain region of an underlying select transistor in or above the substrate.

Example Embodiment 22

A resistive random access memory (RRAM) device includes a conductive interconnect in an inter-layer dielectric (ILD) layer above a substrate. An RRAM element is on the conductive interconnect, the RRAM element including a first electrode layer on the uppermost surface of the conductive interconnect, and a resistance switching layer on the first electrode layer. The resistance switching layer includes a first metal oxide material layer on the first electrode layer, and a plurality of second metal oxide material layers within the first metal oxide material layer. The plurality of second metal oxide material layers includes a metal species not included in the first metal oxide material layer. An oxygen exchange layer is on the first metal oxide material layer of the resistance switching layer. A second electrode layer is on the oxygen exchange layer.

Example Embodiment 23

The RRAM device of example embodiment 22, wherein the first metal oxide material layer is selected from the group consisting of a hafnium oxide layer and a zirconium oxide layer.

Example Embodiment 24

The RRAM device of example embodiment 22, wherein the plurality of second metal oxide material layers is selected from the group consisting of a plurality of titanium oxide layers and a plurality of tantalum oxide layers.

Example Embodiment 25

The RRAM device of example embodiment 22, wherein the first metal oxide material layer is a hafnium oxide layer, and the plurality of second metal oxide material layers is a plurality of titanium oxide layers.

What is claimed is:

1. A resistive random access memory (RRAM) device, comprising:
    a conductive interconnect in an inter-layer dielectric (ILD) layer above a substrate; and
    an RRAM element on the conductive interconnect, the RRAM element comprising:
        a first electrode layer on an uppermost surface of the conductive interconnect;
        a resistance switching layer on the first electrode layer, the resistance switching layer comprising a first metal oxide material layer on the first electrode layer, and a second metal oxide material layer on the first metal oxide material layer, the second metal oxide material layer comprising a metal species not included in the first metal oxide material layer, wherein the second metal oxide material layer is selected from the group consisting of a titanium oxide layer and a tantalum oxide layer;
        an oxygen exchange layer on the second metal oxide material layer of the resistance switching layer; and
        a second electrode layer on the oxygen exchange layer.

2. The RRAM device of claim 1, wherein the first metal oxide material layer is selected from the group consisting of a hafnium oxide layer and a zirconium oxide layer.

3. The RRAM device of claim 1, wherein the first metal oxide material layer is a hafnium oxide layer, and the second metal oxide material layer is a titanium oxide layer.

4. The RRAM device of claim 3, wherein the resistance switching layer has a thickness of approximately 30 Angstroms, the hafnium oxide layer has a thickness of approximately 28 Angstroms, and the titanium oxide layer has a thickness of approximately 2 Angstroms.

5. The RRAM device of claim 3, wherein the resistance switching layer has a thickness of approximately 30 Angstroms, the hafnium oxide layer has a thickness of approximately 25 Angstroms, and the titanium oxide layer has a thickness of approximately 5 Angstroms.

6. The RRAM device of claim 1, further comprising:
    a dielectric sidewall spacer laterally adjacent to and in contact with sidewalls of the second electrode layer, the oxygen exchange layer, the resistance switching layer, and the first electrode layer of the RRAM element.

7. The RRAM device of claim 6, wherein the conductive interconnect is a conductive line further coupled to a second RRAM element.

8. The RRAM device of claim 6, wherein the conductive interconnect is a conductive via.

9. The RRAM device of claim 6, wherein the conductive interconnect is coupled to a drain region of an underlying select transistor in or above the substrate.

10. A resistive random access memory (RRAM) device, comprising:

a conductive interconnect in an inter-layer dielectric (ILD) layer above a substrate; and an RRAM element on the conductive interconnect, the RRAM element comprising:

a first electrode layer on the uppermost surface of the conductive interconnect;

a resistance switching layer on the first electrode layer, the resistance switching layer comprising a first metal oxide material layer on the first electrode layer, and a second metal oxide material layer within the first metal oxide material layer, the second metal oxide material layer comprising a metal species not included in the first metal oxide material layer, wherein the second metal oxide material layer is selected from the group consisting of a titanium oxide layer and a tantalum oxide layer;

an oxygen exchange layer on the first metal oxide material layer of the resistance switching layer; and a second electrode layer on the oxygen exchange layer.

11. The RRAM device of claim 10, wherein the first metal oxide material layer is selected from the group consisting of a hafnium oxide layer and a zirconium oxide layer.

12. The RRAM device of claim 10, wherein the first metal oxide material layer is a hafnium oxide layer, and the second metal oxide material layer is a titanium oxide layer.

13. The RRAM device of claim 12, wherein the resistance switching layer has a thickness of approximately 30 Angstroms.

14. The RRAM device of claim 12, wherein the resistance switching layer has a concentration ratio of approximately 95:5 of the hafnium oxide layer to the titanium oxide layer.

15. The RRAM device of claim 12, wherein the resistance switching layer has a concentration ratio of approximately 90:10 of the hafnium oxide layer to the titanium oxide layer.

16. The RRAM device of claim 10, further comprising:

a dielectric sidewall spacer laterally adjacent to and in contact with sidewalls of the second electrode layer, the oxygen exchange layer, the resistance switching layer, and the first electrode layer of the RRAM element.

17. The RRAM device of claim 10, wherein the conductive interconnect is a conductive line further coupled to a second RRAM element.

18. The RRAM device of claim 10, wherein the conductive interconnect is a conductive via.

19. The RRAM device of claim 10, wherein the conductive interconnect is coupled to a drain region of an underlying select transistor in or above the substrate.

20. A resistive random access memory (RRAM) device, comprising:

a conductive interconnect in an inter-layer dielectric (ILD) layer above a substrate; and an RRAM element on the conductive interconnect, the RRAM element comprising:

a first electrode layer on the uppermost surface of the conductive interconnect;

a resistance switching layer on the first electrode layer, the resistance switching layer comprising a first metal oxide material layer on the first electrode layer, and a plurality of second metal oxide material layers within the first metal oxide material layer, the plurality of second metal oxide material layers comprising a metal species not included in the first metal oxide material layer wherein the plurality of second metal oxide material layers is selected from the group consisting of a plurality of titanium oxide layers and a plurality of tantalum oxide layers;

an oxygen exchange layer on the first metal oxide material layer of the resistance switching layer; and a second electrode layer on the oxygen exchange layer.

21. The RRAM device of claim 20, wherein the first metal oxide material layer is selected from the group consisting of a hafnium oxide layer and a zirconium oxide layer.

22. The RRAM device of claim 20, wherein the first metal oxide material layer is a hafnium oxide layer, and the plurality of second metal oxide material layers is a plurality of titanium oxide layers.

* * * * *